United States Patent [19]

Crawford

[11] 4,249,077
[45] Feb. 3, 1981

[54] ION CHARGE NEUTRALIZATION FOR ELECTRON BEAM DEVICES

[76] Inventor: Charles K. Crawford, c/o Kimball Physics, Inc., Kimball Heights, Wilton, N.H. 03086

[21] Appl. No.: 931,141

[22] Filed: Aug. 4, 1978

[51] Int. Cl.³ .......................................... G01N 23/00
[52] U.S. Cl. ................................ 250/306; 250/311; 250/310
[58] Field of Search ............... 250/305, 309, 310, 397, 250/492 A, 423 R

[56] References Cited

U.S. PATENT DOCUMENTS

| 2,890,342 | 6/1959 | Columbe | 250/306 |
| 3,219,817 | 11/1965 | Möllenstedt | 250/309 |
| 3,665,185 | 5/1972 | Goff | 250/309 |
| 4,052,614 | 10/1977 | Grunthaner et al. | 250/310 |

*Primary Examiner*—Bruce C. Anderson
*Attorney, Agent, or Firm*—Joseph S. Iandiorio

[57] ABSTRACT

An electron beam device in which an electron beam swept over a target causes the buildup of negative charges on the surface of said targets. The negative charges are neutralized by low-kinetic-energy positive ions emitted by an ion source whose output exceeds the number of ions necessary to neutralize the negative charges.

3 Claims, 1 Drawing Figure

U.S. Patent  Feb. 3, 1981  4,249,077
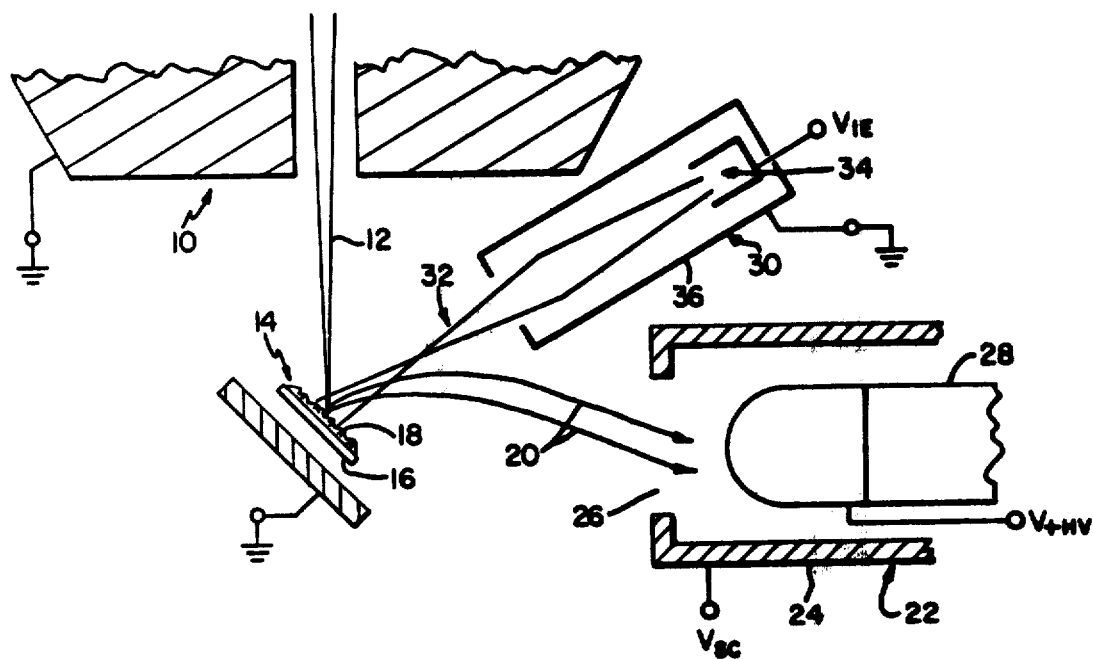

ION CHARGE NEUTRALIZATION FOR ELECTRON BEAM DEVICES

FIELD OF THE INVENTION

This invention relates to improved electron beam apparatus, such as a scanning electron microscope, an electron lithography system, an Auger microprobe, an electron microprobe, or the like, in which a target is illuminated with an electron beam. More specifically, it relates to an electron beam device in which the negative charge deposited on the target by an electron beam is neutralized by positive ions emitted from a source thereof.

BACKGROUND OF THE INVENTION

The invention is directed primarily to apparatus in which an electron beam is swept over a target and a narrow or accurate definition is required for the target area illuminated by the beam. An important example of such a device is a scanning electron microscope, in which an electron beam is swept over a target and secondary electrons or back-scattered primary electrons are collected to generate a signal representing the topographical features scanned by the beam. This signal is then suitably displayed, for example on a cathode ray screen, to provide an enlarged picture of the target. The resolution of the system depends in part on the narrowness of the electron beam and the accuracy with which the position of the beam is controlled.

When the target to be scanned has an electrically non-conducting surface, there is a buildup of negative charge on the surface due to the deposition of electrons from the scanning beam. The field associated with this charge diverts the beam and also spreads it somewhat, with a resulting adverse effect on resolution. It also disturbs the trajectories of the low-energy secondary electrons, thereby diverting a substantial portion from the electron detector and thus degrading the output signal. Moreover, the charge buildup can cause random, localized voltage breakdowns at the target surface, with a resulting deleterious effect on the image.

To overcome this problem the target surface is often rendered electrically conductive by coating it with a suitable conducting material. However, this is a time consuming procedure and it often masks some of the very features which one desired to perceive by means of the microscope. It may also prevent the use of concurrent analysis techniques such as X-ray analysis and Auger electron analysis.

The same problem is encountered in electron beam lithography. An image is traced on a target by an electron beam to control a subsequent etching process thereon. The electron beam is used in order to obtain higher resolution than is readily obtainable with the more conventionally used optical illumination. However, if the target is electrically non-conductive, charge buildup prevents attainment of the desired resolution, causes registration errors and results in other deleterious effects.

The problem is also involved with the examination of insulating specimens in scanning Auger microprobes and in electron microprobes. In Auger microprobes the charge buildup both disturbs the incoming primary beam and causes energy shifts in the Auger spectrum. In electron microprobes the primary beam disturbances are the predominant problem.

One proposed solution to this problem is the inclusion of a secondary electron gun in the vacuum chamber. This gun projects a beam of electrons having a relatively low energy (e.g. 1 keV). In this energy region, the beam causes a net discharge of electrons from the target, thereby tending to positively charge it. Ideally, the positive-charging effect of this beam can be stabilized in position and time to neutralize the negative-charging effect of the primary, high-energy beam, thereby limiting charge buildup on the target surface.

This method has several drawbacks, however. The neutralizing beam cannot be operated simultaneously with primary beam, because electrons emitted from the target as a result of impingement of the neutralizing beam will swamp the signal generated by primary-beam impingement. Therefore, the two beams must be turned on and off alternately, line-by-line or point-by-point. Also, the output of the electron detector must be interrupted when the neutralizing beam is on. Further complications result from the need to have the neutralizing beam accurately cover the area swept by primary beam on the target surface. Moreover, neutralization of negative charge buildup by means of electrons, which are themselves negative, is an inherently unstable process and care must be taken to avoid a runaway condition.

SUMMARY OF THE INVENTION

In accordance with the present invention, I neutralize the negative charge on an electrically non-conducting or electrically isolated target by means of positive ions from an ion source that emits them into the vacuum chamber containing the target. The source emits low-energy ions toward the target and, in the neighborhood of the target, they drift toward the negatively charged portions of the target. There they neutralize the negative charges and in the process are themselves neutralized.

It is desirable that the positive ions be emitted into the vacuum chamber with very low kinetic energy, e.g. with energies below 100 eV although higher energies may sometimes be preferable. This permits the fields within the chamber to have a predominant effect on the trajectories of the ions. The fields resulting from charges on the target thus guide the ions directly to those charges.

More importantly, low energy provides a stable mechanism for almost complete neutralization at a uniform potential, i.e., with a small net positive potential at the target surface. The ion source emits a large excess of the positive ions. Accordingly, all of the negative charges deposited by the primary beam are quickly neutralized by these ions. With the excess of positive ions, there is a tendency to charge the target positively. However, as soon as the voltage at any point on the target builds up to the potential of the ion source, the ions no longer have sufficient energy to reach that point and positive charge buildup at that point ceases.

The low ion energy has the additional advantage that sputtering effects on the specimen are negligible.

The invention thus provides an inherently stable mechanism that maintains each point on the target very close to ground potential. Moreover neutralization does not interfere with the detection of electrons resulting from primary-beam impingement. Both the primary beam and the neutralizing source can therefore operate simultaneously under most circumstances. In unusual cases where the neutralizing ions do generate a signal which interferes with other analysis techniques, e.g. if the ions generate stray electrons by the ion Auger neutralization process, the ion beam may be pulsed so that these electrons do not interfere with the signal resulting from operation of the primary electron beam.

The design of the positive-ion source is not critical. Moreover, many types of ions can be used for neutralization. For example, a surface-ionization source can be used to generate ions of the alkali metal and some of the alkaline earth metals. For other substances, especially those that are gaseous at room temperature, an electron-impact ionization source is preferable. With such a source, however, care must be taken to prevent leakage of electrons from the source, since any electrons that escape may reach the detector and thereby add noise to its output. The gas to be ionized in a source of this type can be injected into the source through a gas feed or, alternatively, the residual gas in the vacuum chamber can provide the molecules to be ionized.

In some circumstances it may be desirable to provide the ion source wilth focusing and deflection electrodes to control the emerging ion beam. This will allow increased ion current density on a small area of the target. It will thereby provide more efficient neutralization when the primary electron beam is made to impinge on only a small area or when its current density is particularly high.

I have found that a surface-ionization source emitting lithium ions is effective for charge neutralization of biological specimens and many insulators, such as ceramics, glass, plastics and cloth. On the other hand lithium atoms have a deleterious effect on silicon semiconductor components and therefore, when the invention is used in connection with semiconductor components or in electron beam lithography, I prefer to use an electron-impact source emitting argon ions for charge neutralization. An electron-impact source utilizing the vacuum system background gas, consisting primarily of water vapor, nitrogen and oxygen, is particularly convenient for many applications, since the gas is essentially inexhaustible and an ion source of this type is simple and reliable.

BRIEF DESCRIPTION OF THE DRAWING

The drawing is a schematic diagram of a scanning electron microscope incorporating the invention.

DETAILED DESCRIPTION OF THE INVENTION

The scanning electron microscope shown in the drawing includes an electron-beam-forming and -focusing assembly, fragmentarily depicted at 10, which sweeps an electron beam 12 over a target 14. The target 14 includes a substrate 16 on which is mounted a specimen 18 to be studied by means of the microscope. As the beam 12 impinges on successive portions of the surface of the specimen 18, it causes the emission of secondary electrons from those portions. As indicated by the arrows 20, these electrons move to a detector 22, toward which they are attracted by an electrode 24 having an aperture 26 through which the electrons pass to a collector 28. The aperture 26 is sometimes covered by a grid (not shown). The electrode 24 is maintained at a suitable positive potential $V_{SC}$; the collector 28 is maintained at a high positive potential $V_{HV}$. The system is housed in a suitable vacuum chamber, also not shown in the drawing.

The kinetic energies of the electrons in the beam 12 are such that the number of electrons leaving the target, i.e., the sum of the low-energy secondaries and the back-scattered primaries, is substantially less than the number of electrons in the beam 12 impinging on the specimen 18. Therefore, if the specimen is electrically non-conductive or electrically isolated, a net negative charge is deposited on the specimen 18 by the beam 12. The field associated with this charge distorts the beam as described above and thereby degrades the picture that is generated from the output of the detector 22.

In accordance with the invention, the negative charge on the specimen 18 is neutralized by positive ions emitted from an ion source 30 in the vacuum chamber. The source 30 projects a beam 32 of these ions toward the target 14 with very low kinetic energies. The trajectories of the ions are thus influenced significantly by the electric fields encountered by them after leaving the source 30 and, specifically, by the fields associated with the charges deposited on the specimen 18. The positive ions therefore drift toward the negative charges and neutralize them as described above. They thus eliminate the above-mentioned beam distortions, with a resulting improvement in resolution. This improvement manifests itself visually as a marked improvement in the quality of pictures obtained with the microscope.

The ion source 30, which is small enough to fit in the location shown in the drawing, includes an ion-generation region, generally indicated at 34, which is maintained at a positive potential $V_{IE}$. A housing 36 for the source 30 is normally maintained at ground potential. The ions thus have kinetic energies of approximately $eV_{IE}$ as they are emitted toward the specimen.

In some cases it will be desirable to have $V_{IE}$ equal to ground potential and maintain the housing 36 at a negative potential, such that a more nearly exactly ground-potential neutralization can be achieved. In some cases it is desirable to have the voltages variable so that useful voltage contrast effects in the images of the observed surface may be obtained.

Preferably the ion source 30 is positioned on the same side of the primary beam 12 as the detector 22. The field associated with the detector electrode 24 will then urge the positive ions toward the target 14 instead of away from it. In some cases it may be desirable to include additional field control electrodes (not shown) in the neighborhood of the target 14. These electrodes will reduce and control the effects of the field of the electrode 24, and any other electric fields in the vacuum chamber on the ion beam 32. The ion beam can thus neutralize the specimen charge buildup without itself being disturbed by unwanted effects.

What is claimed as new and desired to be secured by Letters Patent of the United States is:

1. In an electron beam device of the type in which a narrowly defined electron beam is swept over a target, the improvement comprising a positive ion source arranged to supply positive ions to said target and thereby neutralize negative charges on said target resulting from impingement of said electron beam thereon.

2. The device defined in claim 1 in which said source emits ions having a kinetic energy less than about 100 electron volts.

3. The device defined in claim 1 in which said source emits said ions at a rate substantially in excess of the rate at which negative charges are generated on said target by said beam.

* * * * *